United States Patent [19]

Kato

[11] Patent Number: 5,034,925
[45] Date of Patent: Jul. 23, 1991

[54] SEMICONDUCTOR MEMORY DEVICE WITH REDUNDANCY RESPONSIBLE TO ADVANCED ANALYSIS

[75] Inventor: Yasushi Kato, Tokyo, Japan

[73] Assignee: NEC Corporation, Tokyo, Japan

[21] Appl. No.: 441,661

[22] Filed: Nov. 27, 1989

[30] Foreign Application Priority Data

Nov. 28, 1988 [JP] Japan .............................. 63-299972

[51] Int. Cl.⁵ .............................................. G11C 7/00
[52] U.S. Cl. .................................. 365/200; 365/225.7; 371/10.2
[58] Field of Search ...................... 365/200, 201, 225.7, 365/193; 371/10.1, 10.2, 21.1

[56] References Cited

U.S. PATENT DOCUMENTS 4,862,416 8/1989 Takeuchi .......................... 365/200 X Primary Examiner—Joseph A. Popek
Attorney, Agent, or Firm—Sughrue, Mion, Zinn, Macpeak & Seas

[57] ABSTRACT

A semiconductor memory device of the type having redundant memory cells is capable of replacing defective memory cells with the redundant memory cells for providing a rescue, and the redundant memory cells are activated upon an access to one of the defective memory cells, however, the semiconductor memory device according to the present invention is responsive to an external controlling signal for forcibly canceling the replacement, so that the defective memory cells are accessible for trouble shooting after the replacement.

11 Claims, 3 Drawing Sheets

SEMICONDUCTOR MEMORY DEVICE WITH REDUNDANCY RESPONSIBLE TO ADVANCED ANALYSIS

FIELD OF THE INVENTION

This invention relates to a semiconductor memory device with redundancy and, more particularly, to an analytical capability responsible to an advanced trouble analysis.

DESCRIPTION OF THE RELATED ART

A prior art semiconductor memory device of the type having redundant memory cells is usually checked to see whether or not any defective memory cells are incorporated in a memory cell array, and the defective memory cells are replaced with the redundant memory cells for. In order to surely provide the rescue, it is necessary to previously diagnose the redundant memory cells for a confirmation of the abilities of the redundant memory cells. When the defective memory cells are replaced with the redundant memory cells, any access to the defective cell is transferred to the redundant memory cell, and, for this reason, the addresses assigned to all of the defective memory cells are detectable after the replacement with the redundant memory cells.

A prior art semiconductor memory device is by way of example shown in FIG. 1 of the drawings, and largely comprises a regular memory cell array 2 associated with a row address decoder unit 4 as well as the combination of a column decoder unit 6 and a column selector unit 8. The row address decoder unit 4 consists of a plurality of AND gates A1 to An, and row address bits or the complementary bits thereof are selectively supplied to the AND gates A1 to An together with a disable signal DENL. When an address signal consisting of the row address bits and column address bits are supplied from the outside of the semiconductor memory device, a data bit is read out from the memory cell of the array 2 and transferred to a combination unit 10 of a sense amplifier circuit and a data buffer circuit. The semiconductor memory device shown in FIG. 1 further comprises redundant memory cells 12 which are associated with a replacing unit 14 provided with fuse elements such as a fuse element 16 for memorizing the replacement with the redundant memory cell, and a detecting circuit 18 produces an enable signal ENL and a complementary signal thereof or the disable signal DENL depending upon the state of the fuse element 16.

Namely, if any defective memory cell is incorporated in the regular memory cell array 2 and is replaced with the redundant memory cell 12, the fuse element is melted away, and, for this reason, the detecting circuit 18 produces the enable signal ENL of an active high voltage level, On the other hand, an inverter circuit 20 produces the disable signal DENL of an inactive low voltage level. However, if no replacement is carried out between the defective memory cell and the redundant memory cell 12, the fuse element 16 still bridges the detecting circuit and a ground node, so that the enable signal ENL remains in the inactive low voltage level, but the disable signal DENL goes up to the active high voltage level.

The disable signal DENL is supplied to the AND gates A1 to An, and the enable signal ENL is transferred to an AND gate Ar. Thus, the row address decoder unit 4 is activated or remains in the inactive state depending upon the disable signal DENL, and the redundant memory cells 12 are accessed instead of the regular memory cells in the activation with the enable signal ENL of the high voltage level.

Since the fuse element 16 is permanently destroyed upon the replacement between the regular memory cell and the redundant memory cell, the defective memory cell can not be accessed from the outside of the semiconductor memory device after the replacement with the redundant memory cell. Then, a problem is encountered in the prior art semiconductor memory device in that the defective memory cell can not be accessed for an analysis of trouble. This is a serious barrier for the trouble shooting.

SUMMARY OF THE INVENTION

It is therefore an important object of the present invention to provide a semiconductor memory device which can provide an access to a detective memory cell even if the defective memory cell is replaced with a redundant memory cell.

To accomplish these objects, the present invention proposes to cancel an enable signal of an active level with an external signal and, accordingly, shift the disable signal to the inactive level.

In accordance with the present invention, there is provided a semiconductor memory device fabricated on a semiconductor substrate, comprising: )a) a plurality of regular memory cells arranged in rows and columns and memorizing a plurality of data bits, respectively, the regular memory cells being capable of containing a defective memory cell; (b) a plurality of word lines respectively coupled to the rows of the regular memory cells; (c) a plurality of column lines respectively coupled to the columns of the regular memory cells; (d) a row address decoder unit responsive to row address bits and selectively driving the word lines in an activated state thereof for providing conduction paths between the column lines and one of the rows of the regular memory cells; (e) a combined unit of sense amplifier and data transferring circuits provided in association with the column lines for communication with the outside of the semiconductor memory device; (f) a column selector unit coupled between the column lines and the combined unit of sense amplifier and data transferring circuits for providing a conductive path to the combined unit; (g) a column address decoder unit responsive to column address bits and steering the column selector unit; (h) a plurality of redundant memory cells provided in association with the regular memory cells, the defective memory cell being replaced with one of the redundant memory cells when the redundant memory cells are activated; (i) a redundant unit operative to activate the redundant memory cells in an activated state thereof; and (j) a controlling unit associated with the row address decoder unit and the redundant unit and operative to produce an enable signal for complementarily shifting the row address decoder unit and the redundant unit between the activated states and inactivated states, in which the controlling unit comprises (j-1) an information storage for storing a piece of information indicative of a replacement between the defective memory cell and the redundant memory cell, (j-2) an interpreting circuit operative to produce an interpretative signal indicative of the presence of the piece of information, (j-3) a detecting circuit operative to detect an external controlling signal indicative of forcibly activating the row address decoder unit for producing a strobe signal, and (j-4) a logic circuit responsive to the interpretative signal in the absence of the external controlling signal for activating the redundant memory cells and responsive to the strobe signal for activating the row address decoder unit even though the interpretative signal is produced.

BRIEF DESCRIPTION OF THE DRAWINGS

The features and advantages of a semiconductor memory device according to the present invention will be more clearly understood from the following description taken in conjunction with the accompanying drawings in which.

DESCRIPTION OF THE PREFERRED EMBODIMENTS

FIRST EMBODIMENT

Figure 1:
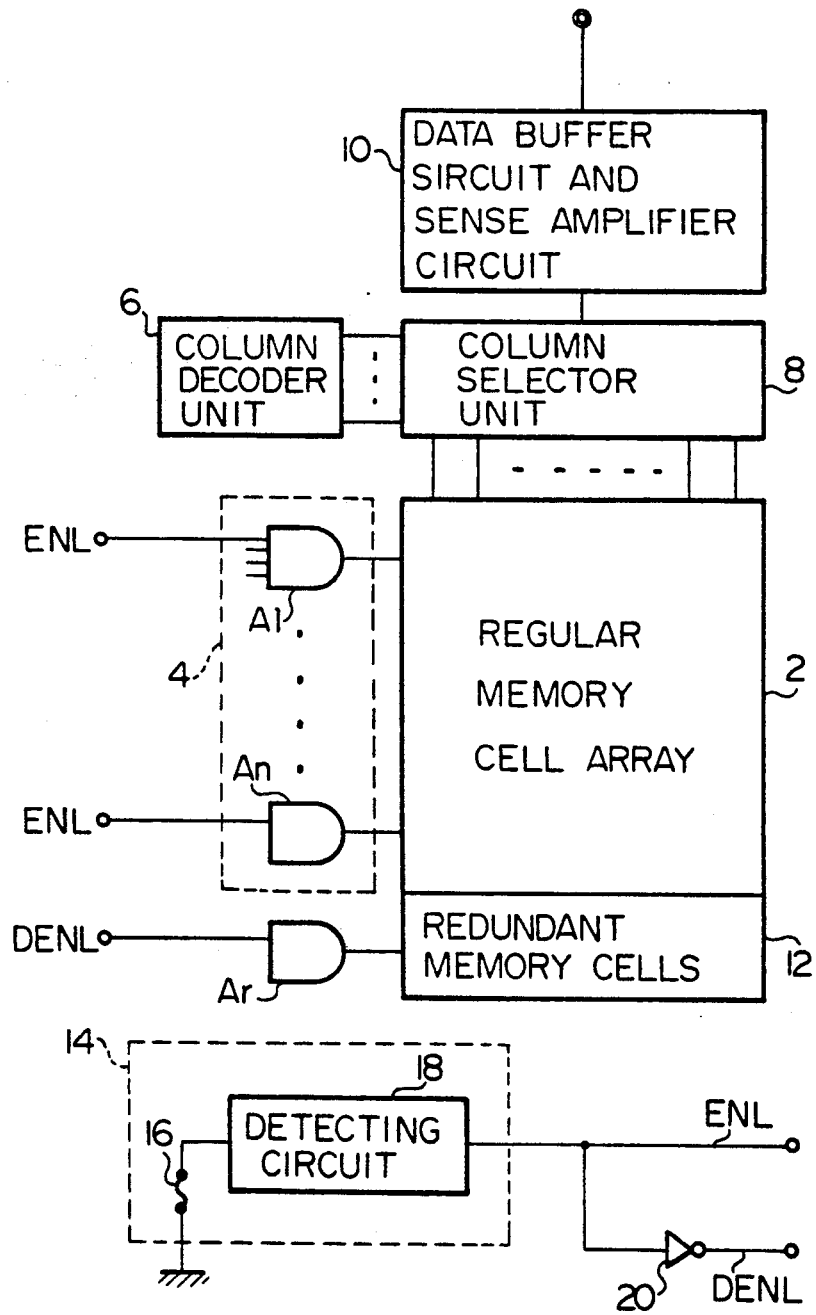
FIG. 1 is a block diagram showing the circuit arrangement of the prior art semiconductor memory device of the type having a redundancy.
Figure 2:
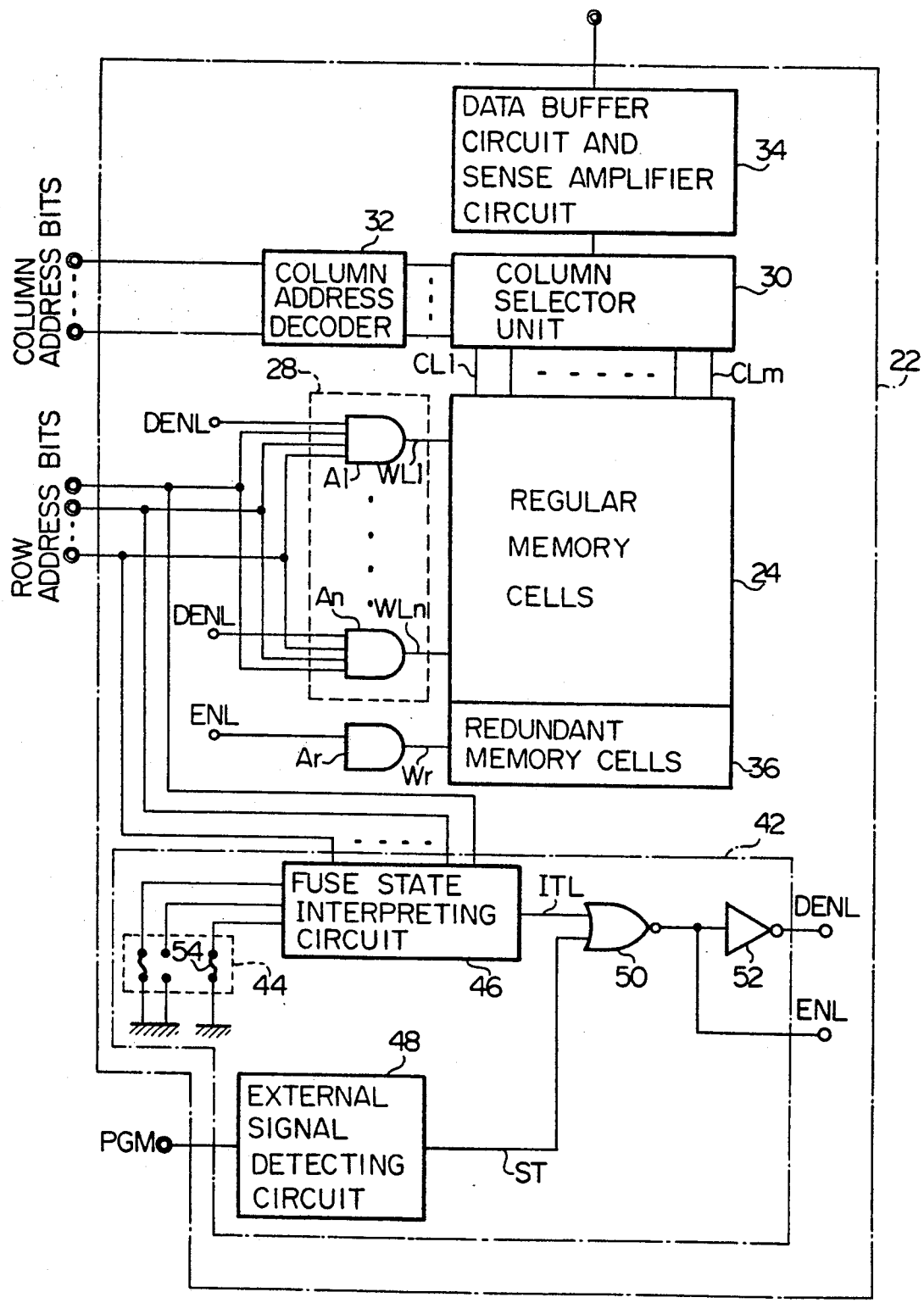
FIG. 2 diagram showing the circuit arrangement of a semiconductor memory device embodying the present invention.

Referring first to FIG. 2 of the drawings, a semiconductor memory device according to the present invention is fabricated on a semiconductor chip 22, and comprises regular memory cells 24 arranged in rows and columns for memorizing respective data bits. In this instance, the regular memory cells 24 are of the electrically programmable read only memory cell. The rows of the regular memory cells 24 are respectively coupled to word lines W1 to Wn, and bit lines CL1 to CLm are shared by the columns of the regular memory cells, respectively. The word lines W1 to Wn are driven by a row address decoder unit 28 which is constituted by a plurality of AND gates A1 to An. Row address bits and the complementary bits thereof are selectively supplied in parallel to the AND gates A1 to An, and one of the word lines W1 to Wn are shifted to an active level depending upon the bit string of the combination of the row address bits and the complementary bits. However, since a disable signal DENL of an active low voltage level is supplied to all of the AND gates A1 to An, no word lines is activated in the presence of the disable signal DENL. The bit lines CL1 to CLm are coupled to a column selector unit 30 which is controlled by a column address decoder unit 32, and column address bits are supplied to the column address decoder unit 32 for causing the column selector unit 30 to be transparent to one of the data bits on the bit lines CL1 to CLm. The column selector unit 30 is associated with a combined unit 34 of a sense amplifier circuit and a data buffer circuit, and the sense amplifier circuit rapidly decides on the logic level of the data bit for supplying the data bit from the data buffer circuit to the outside thereof.

The semiconductor memory device shown in FIG. 2 further comprises redundant memory cells 36 arranged in a row, and a redundant word line Wr is coupled to the redundant memory cells 36. The redundant memory cells 36 are respectively coupled to the bit lines CL1 to CLm, and the redundant word line Wr is driven by an AND gate Ar. The redundant memory cells 36 are also of the electrically programmable read only memory cell. In this instance, the AND gate Ar provides a redundant unit.

The semiconductor memory device shown in FIG. 2 further comprises a controlling unit 42 which in turn comprises a fuse array 44, a fuse state interpreting circuit 46, an external signal detecting circuit 48 and a logic circuit having a NOR gate 50 and an inverter circuit 52. The fuse array 44 is constituted by a plurality of fuse elements including a fuse element 54, and the fuse element 54 is broken away by application of, for example, an extremely high voltage signal upon a replacement between a defective memory cell and one of the redundant memory cells 36. However, the other fuse elements are used for memorizing the row address assigned to the defective memory cell. The fuse state interpreting circuit 46 is activated by breaking the fuse element 54 to produce an interpretative signal ITL of logic "0" level upon matching the row address represented by the row address bits with the row address memorized in the other fuse elements, however, the interpretative signal ITL remains in logic "1" in the other status.

The external signal detecting circuit 48 is responsive to a programming signal PGM which is used for memorizing the data bits in the regular memory cells 24 and the redundant memory cells 36, and produces a strobe signal ST of logic "1" level in the presence of the programming signal PGM of an extremely high voltage level. However, the strobe signal ST remains in logic "0" level in the absence of the programming signal PGM. The interpretative signal ITL and the strobe signal ST are supplied to the NOR gate 50, and the NOR gate 50 produces the enable signal ENL of the active high voltage level in the co-presence of the interpretative signal ITL of logic "0" level and the strobe signal of logic "0" level. The enable signal ENL is supplied to the AND gate Ar to activate the redundant memory cells 36, and is further supplied to an inverter circuit 52 for producing the complementary signal or the disable signal DENL. The disable signal DENL is supplied to the AND gates A1 to An for maintaining them in the inactive states, and, for this reason, the data bit is read out from the redundant memory cell instead of the defective memory cell.

However, if the programming signal PGM of the extremely high voltage level is supplied to the external signal detecting circuit 48, the strobe signal goes up to the logic "1" level, and, for this reason, the NOR gate 50 does not respond to the interpretative signal ITL. This results in the enable signal of the inactive low voltage level and the disable signal of the inactive high voltage level. Then, the AND gate Ar never activate the redundant memory cells 36 upon the matching state, however, one of the word lines is driven by the associated AND gate for accessing the defective memory cell. Thus, the semiconductor memory device according to the present invention allows the outside device to access the defective memory cell even though the defective memory cell was replaced with the redundant memory cell, so that the trouble of the defective memory cell is easily analyzed from the outside thereof.

SECOND EMBODIMENT

Figure 3:
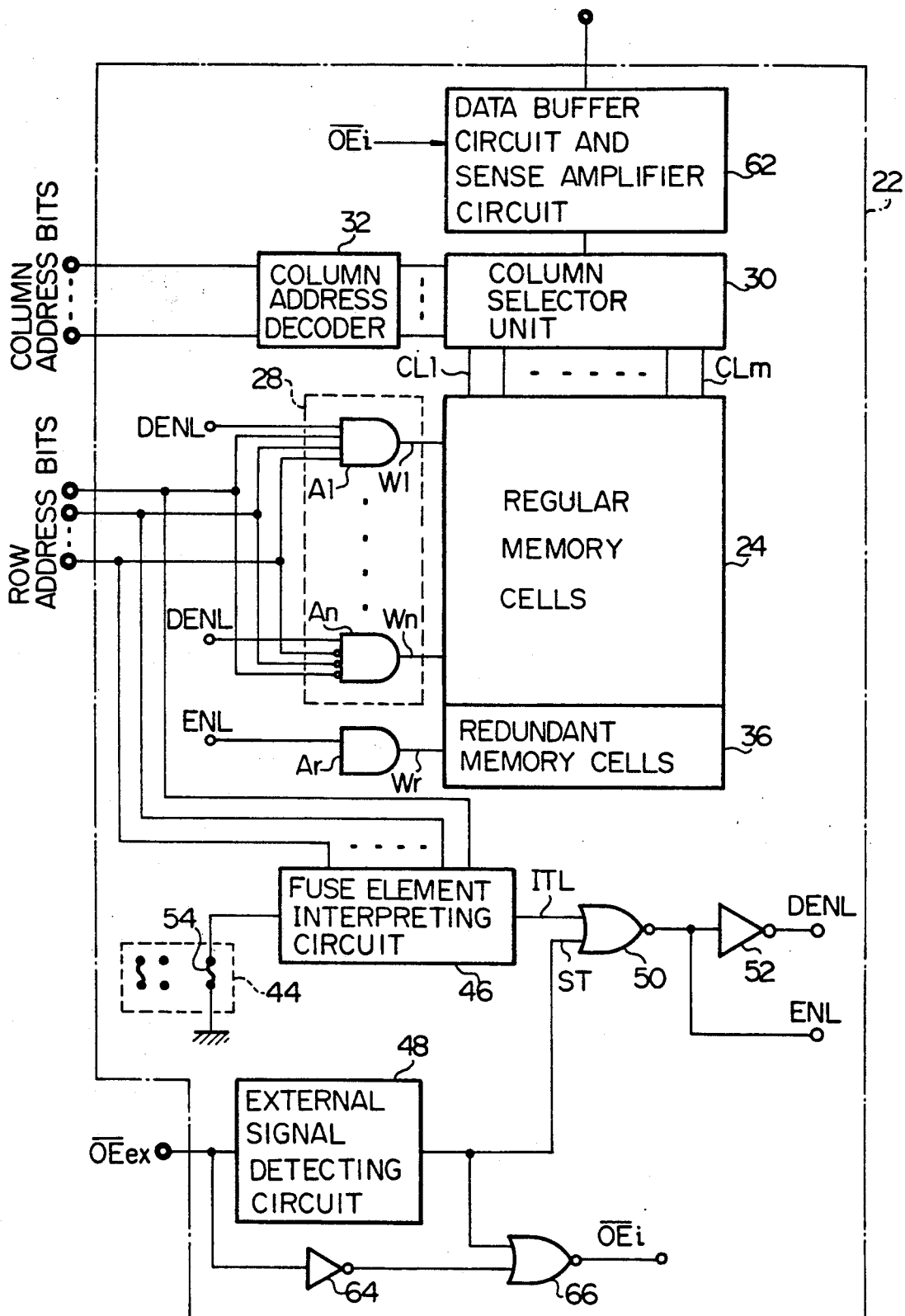
FIG. 3 is a block diagram showing the circuit arrangement of another semiconductor memory device embodying the present invention.

Turning to FIG. 3 of the drawings, the circuit arrangement of another semiconductor memory cell is illustrated. However, the semiconductor memory device shown in FIG. 3 is similar in circuit arrangement to the semiconductor memory device shown in FIG. 2 except for a combined unit of sense amplifier and data transferring circuits 62 and a logic circuit, so that the corresponding units and circuits are designated by the same reference numerals and symbols without any detailed description.

The combined unit 62 is responsive to an internal output enable signal OEi of the active low voltage level for transferring the data bit to the outside thereof, and an external output enable signal OEex of the active low voltage level is supplied to the external signal detecting circuit 48. When the external output enable signal OEex goes up to an extremely high voltage level, the external signal detecting circuit 48 shifts the strobe signal ST to the logic "1" level, so that the defective memory cell is accessible from the outside in the similar manner to the first embodiment. The logic circuit further comprises an inverter circuit 64 and a NOR gate 66, and the NOR gate 66 produces the internal output enable signal OEi of the active low voltage level in the presence of the external output enable signal OEex of the extremely high voltage level, so that no trouble takes place in the data bit transferring operation.

Although particular embodiments of the present invention have been shown and described, it will be obvious to those skilled in the art that various changes and modifications may be made without departing from the spirit and scope of the present invention. For example, the redundant memory cells are arranged in a row for coupling in parallel to the bit lines in the embodiments shown in FIGS. 2 and 3, however, a plurality of rows of the redundant memory cells may be provided in the semiconductor memory device so as to cope with the defective memory cells spread over some rows. Moreover, the redundant memory cells may be arranged in column or columns for replacement with the columns of the regular memory cells, and may be further arranged in rows and columns for replacement with the regular memory cells. Moreover, the regular memory cells and the redundant memory cells may be of another cell type such as, for example, an electrically erasable programmable read only memory cell.

What is claimed is:

1. A semiconductor memory device fabricated on a semiconductor substrate, comprising:
   (a) a plurality of regular memory cells arranged in rows and columns and storing a plurality of data bits, respectively, said regular memory cells being capable of containing a defective memory cell;
   (b) a plurality of word lines respectively coupled to the rows of said regular memory cells;
   (c) a plurality of column lines respectively coupled to the columns of said regular memory cells;
   (d) a row address decoder unit responsive to row address bits and selectively driving said word lines in an activated state thereof for providing conduction paths between said column lines and one of the rows of said regular memory cells;
   (e) a combined unit of sense amplifier and transferring circuits provided in association with said column lines for communication with an external device located outside of said semiconductor memory device;
   (f) a column selector unit coupled between said column lines and said combined unit of sense amplifier and transferring circuits for selectively coupling one of said column lines and the combined unit;
   (g) a column address decoder unit responsive to column address bits and designating said one of said column lines;
   (h) a plurality of redundant memory cells provided in association with said regular memory cells, said defective memory cell being replaced with one of said redundant memory cells when the redundant memory cells are activated;
   (i) a redundant unit operative to activate said redundant memory cells in an activated state thereof in the presence of an enable signal; and
   (j) a controlling unit associated with said row address decoder unit and said redundant unit and operative to produce said enable signal for complementarily shifting the row address decoder unit and said redundant unit between said activated states and inactivated states, in which said controlling unit comprises (j-1) a memory circuit for storing a piece of information indicative of a replacement between said defective memory cell and said redundant memory cell, (j-2) an interpreting circuit operative to produce an interpretative signal indicative of the presence of said piece of information, (j-3) a detecting circuit operative to detect an external controlling signal indicative of forcibly activating said row address decoder unit for producing a strobe signal, and (j-4) a logic circuit responsive to said interpretative signal in the absence of said external controlling signal for activating said redundant memory cells and responsive to said strobe signal for activating said row address decoder unit even though the interpretative signal is produced.

2. A semiconductor memory device as set forth in claim 1, in which said memory circuit has a fuse element broken upon said replacement between said defective memory cell and said redundant memory cell for producing said interpretative signal of logic "0" level, however, said interpretative signal remains in logic "1" level if no replacement is carried out.

3. A semiconductor memory device as set forth in claim 2, in which said external signal detecting circuit produces said strobe signal of logic "1" level in the presence of said external controlling signal, however, said strobe signal remains in logic "0" level in the absence of said external controlling signal.

4. A semiconductor memory device as set forth in claim 3, in which said logic circuit has a NOR gate supplied with said interpretative signal and said strobe signal and operative to produce said enable signal of logic "1" due to said interpretative signal of logic "0" level in the absence of said external controlling signal, and an inverter for producing the complementary signal of said enable signal.

5. A semiconductor memory device as set forth in claim 4, in which said row address decoder unit has a plurality of AND gates respectively coupled to said word lines and supplied with the complementary signal of said enable signal, and in which said redundant unit has an AND gate supplied with said enable signal.

6. A semiconductor memory device as set forth in claim 5, in which said external controlling signal has an extremely high voltage level in comparison with other external signals including an address signal with said row and column address bits.

7. A semiconductor memory device as set forth in claim 6, in which said regular memory cells and said redundant memory cells are of the electrically programmable read only memory cell.

8. A semiconductor memory device as set forth in claim 7, in which a programming signal used for storing said data bits into said regular memory cells and said redundant memory cells serves as said external controlling signal.

9. A semiconductor memory device as set forth in claim 6, in which said combined unit of sense amplifier and data transferring circuits is responsive to an internal output enable signal of an active low voltage level for transferring said data bit to the outside.

10. A semiconductor memory device as set forth in claim 9, in which an external output enable signal of an active low voltage level serves as said external controlling signal.

11. A semiconductor memory device as set forth in claim 10, in which said logic circuit further has an inverter supplied with said external output enable signal and a NOR gate supplied with said strobe signal and the complementary signal of said external output enable signal for producing said internal output enable signal.

* * * * *